(12) United States Patent
Yeh et al.

(10) Patent No.: US 6,211,023 B1
(45) Date of Patent: Apr. 3, 2001

(54) METHOD FOR FABRICATING A METAL-OXIDE SEMICONDUCTOR TRANSISTOR

(75) Inventors: Wen-Kuan Yeh, Chupei; Jih-Wen Chou, Hsinchu, both of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/191,202

(22) Filed: Nov. 12, 1998

(51) Int. Cl.⁷ .................................................. H01C 21/336
(52) U.S. Cl. ..................... 438/299; 438/301; 438/303; 438/305; 438/306; 438/307
(58) Field of Search .................................. 438/229, 230, 438/231, 232, 299, 301, 303, 305, 306, 307, 514, 519, 521, 527, 529

(56) References Cited

U.S. PATENT DOCUMENTS

| | | | |
|---|---|---|---|
| 4,597,824 | * | 7/1986 | Shinada et al. . |
| 4,746,624 | * | 5/1988 | Cham et al. . |
| 5,015,599 | * | 5/1991 | Verhaar . |
| 5,171,700 | * | 12/1992 | Zamanian . |
| 5,362,982 | * | 11/1994 | Hirase et al. . |
| 5,492,847 | * | 2/1996 | Kao et al. . |
| 5,514,611 | * | 5/1996 | Kim et al. . |
| 5,723,352 | * | 3/1998 | Shih et al. . |
| 5,776,806 | * | 7/1998 | Dennison et al. . |
| 5,793,090 | * | 8/1998 | Gardner et al. . |
| 5,811,340 | * | 9/1998 | Park . |
| 5,885,886 | * | 3/1999 | Lee . |
| 5,895,238 | * | 4/1999 | Mitani . |
| 5,937,293 | * | 8/1999 | Lee . |
| 5,950,082 | * | 8/1998 | Gardner . |
| 5,963,798 | * | 10/1999 | Kim et al. . |
| 5,976,923 | * | 11/1999 | Tung . |
| 5,985,727 | * | 11/1999 | Burr . |
| 5,998,274 | * | 12/1999 | Akram et al. . |
| 5,998,284 | * | 12/1999 | Azuma . |
| 6,004,851 | * | 12/1999 | Peng . |
| 6,008,099 | * | 12/1999 | Sultan et al. . |
| 6,010,936 | * | 1/2000 | Son . |
| 6,017,798 | * | 1/2000 | Ildeerem et al. . |
| 6,022,785 | * | 2/2000 | Yeh et al. . |
| 6,025,239 | * | 2/2000 | Yu . |
| 6,025,242 | * | 1/1999 | Ma et al. . |
| 6,030,869 | * | 9/1998 | Odake et al. . |

* cited by examiner

Primary Examiner—John F. Niebling
Assistant Examiner—Jonathan Hack
(74) Attorney, Agent, or Firm—Blakely Sokoloff Taylor & Zafman (57) ABSTRACT

A method for fabricating a metal-oxide semiconductor (MOS) transistor. A substrate having a gate structure is provided. The method of the invention includes forming a liner spacer on each side of the gate structure and a low dopant density region deep inside the substrate. The low dopant density region has a lower dopant density than that of a lightly doped region of the MOS transistor. Then a interchangeable source/drain region with a lightly doped drain (LDD) structure and an anti-punch-through region is formed on each side of the gate structure in the low dopant density region. The depth of the interchangeable source/drain region is not necessary to be shallow.

20 Claims, 5 Drawing Sheets

METHOD FOR FABRICATING A METAL-OXIDE SEMICONDUCTOR TRANSISTOR

BACKGROUND OF THE INVENTION

1. Field of the Invention

This invention relates to semiconductor fabrication, and more particularly to a method for fabricating a metal-oxide semiconductor (MOS) transistor, using an improved ion implantation process.

2. Description of Related Art

A semiconductor device always includes several MOS transistors, which are fabricated in high integration so as to form an integrated circuit (IC) device. The MOS transistors are the fundamental elements of the IC device. Its properties, such as operation speed, determine the performance of the IC device.

Figure 1A:
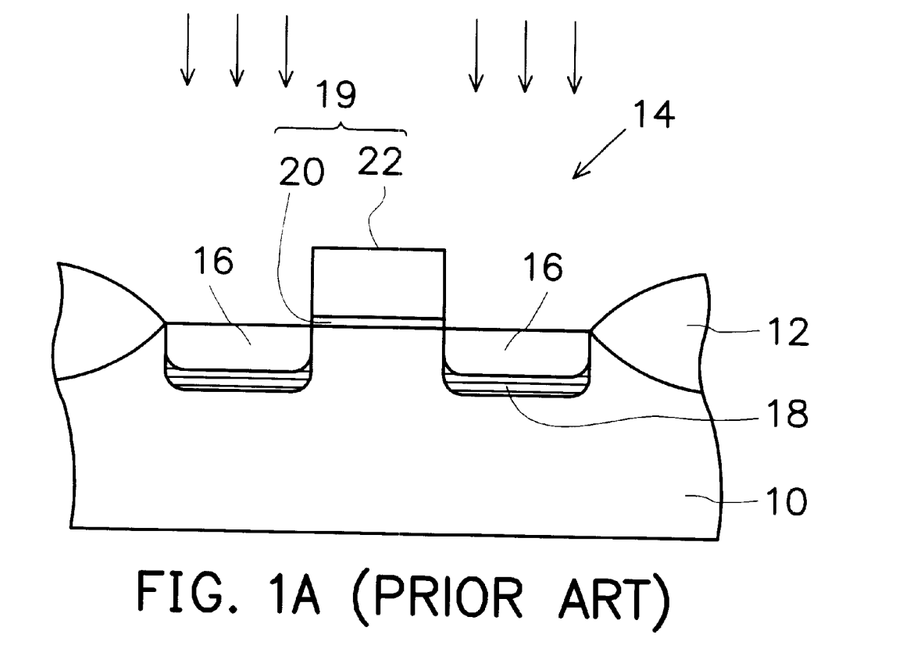
FIGS. 1A–1C are cross-sectional views of a MOS transistor, schematically illustrating a conventional fabrication process of the MOS transistor.
Figure 1B:
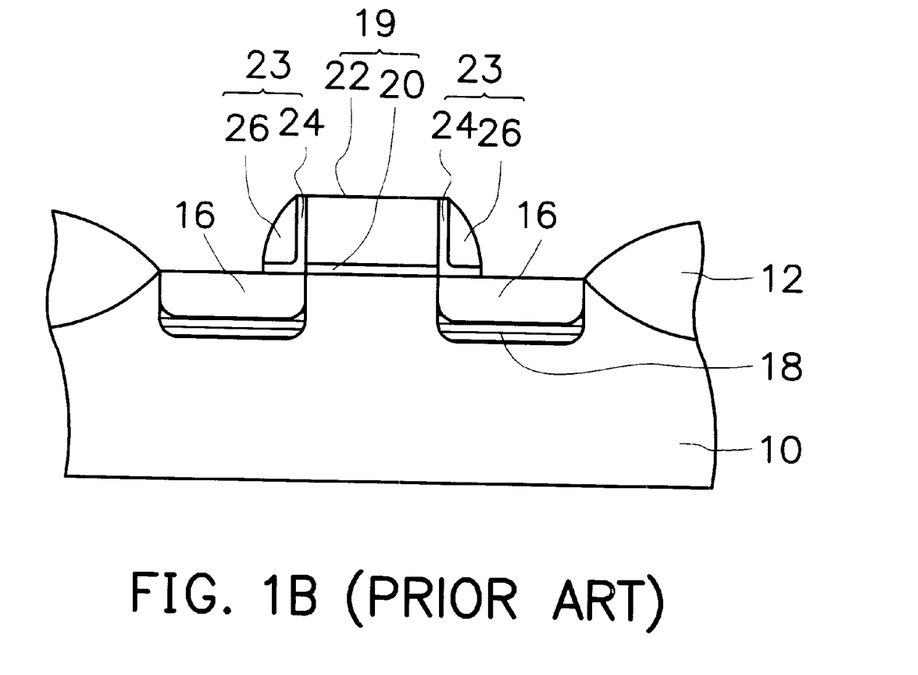
Figure 1C:
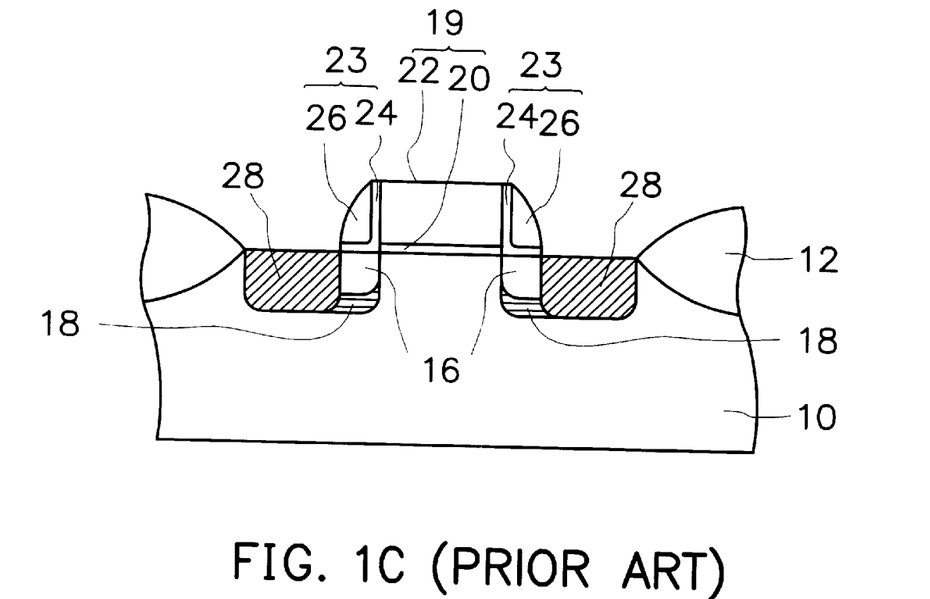

FIGS. 1A–1C are cross-sectional views, schematically illustrating a conventional fabrication process of a MOS transistor. In FIG. 1A, a field oxide layer (FOX) 12 serving as an isolation structure is formed on a semiconductor substrate 10. An area of the substrate 10 other than the FOX layer 12 is called an active area, where an MOS transistor 14 is formed. The MOS transistor 14 includes a gate oxide layer 20, a gate 22, and a lightly doped region 16, in which the gate oxide layer 20 and the gate 22 forms together as a gate structure 19. Conventionally, in order to prevent a punch through effect from occurring on the junction, an anti-punch-through implantation is usually performed to form a halo doped region 18 below the lightly doped region 16 by a higher ion energy beam. The dopant type of the halo doped region 18 is opposite to the dopant type doped in the interchangeable source/drain region. A dopant conventionally may be viewed as a substance, such as boron, added in small amounts to a pure semiconductor material to alter its conductive properties for use in transistors and diodes.

In FIG. 1B, a thin conformal silicon dioxide layer (not shown) is formed over the substrate 10, and a silicon nitride layer (not shown) is formed on the silicon dioxide layer. An etching back process is performed to remove the silicon nitride layer and the silicon dioxide layer, all of which respectively leave a silicon dioxide remains 24, or called a liner oxide layer 24, and a silicon nitride remains 26 and form together on each side of the gate structure 19 to serve as a sidewall spacer. As seen in FIG. 1B, the liner oxide layer 24 extends over the lightly doped region 16. This extension may be throught of as an extension of gate oxide layer 20 that overlaps the lightly doped region 16.

In FIG. 1C, using the FOX layer 12, the gate structure 19 as a mask, an ion implantation process with a higher dosage density is performed to dope an exposed area of the substrate 10 at the lightly doped region 16. After an annealing process, a heavily doped region 28 abutting the lightly doped region 16 and the halo doped region 18 is formed. All of the lightly doped region 16, the heavily doped region 28 and the halo doped region 18 serve together as an interchangeable region of the transistor 14.

In the above descriptions, for a design of a sub-micron IC device, in order to prevent the punch through effect from occurring on the junction, which is the interchangeable source/drain region, the anti-punch-through implantation is usually performed to form the halo doped region 18 below the lightly doped region 16.

Moreover, in order to increase an direct-current (DC) operation speed of the MOS transistor 14 of FIG. 1A, the heavily doped region 28 is necessary to be formed.

However, a depletion region usually exists at an interface of the interchangeable source/drain region and the substrate due to, for example, a depletion of electron-holes for P-type substrate. This depletion region behaves like an capacitor and contributes a junction capacitance. The junction capacitance is larger if the depletion region is larger. The depletion region is larger if the dopant density is larger or junction contact area is larger. A higher dopant density also needs a higher dopant density in the halo doped region in order to reduce a short channel effect. Since the heavily doped region 28 carries higher dopant density, it results in a higher junction capacitance. It is natural for an AC circuit that the junction capacitance can reduce an alternative-current (AC) operation speed. In addition, the gate oxide layer also induces an oxide capacitor, which is coupled with the junction capacitor in series. The oxide capacitor increases the junction capacitance and causes a slower AC operation speed.

Furthermore, if the junction capacitance is reduced through a reduction of the junction contact area, the junction depth is usually reduced. This causes a difficult control on the margin of junction.

SUMMARY OF THE INVENTION

It is therefore an objective of the present invention to provide an improved method for forming an interchangeable source/drain region. The improved method includes a formation of a low dopant density region below the interchangeable source/drain region so as to reduce a junction capacitance. An AC operation speed is further increased.

It is another an objective of the present invention to provide an improved method for forming an interchangeable source/drain region. The improved method includes a formation of a low dopant density region below the interchangeable source/drain region so as to allow a thicker junction depth to be formed. Thus a margin of the junction can be more easily controlled.

It is still another an objective of the present invention to provide an improved method for forming a spacer on each sidewall of a gate structure. The improved method includes forming a thin liner spacer instead so as to reduce a lateral extension length of the interchangeable source/drain region. The overlap region between the gate structure and the interchangeable source/drain region is therefore reduced so that a less overlapping capacitance can be obtained. An AC operation speed is further increased.

In accordance with the foregoing and other objectives of the present invention, an improved method for fabrication a MOS transistor is provided. The improved method is suitable for a semiconductor substrate having a gate structure. The improved method includes forming a liner spacer on each side of the gate structure. Using the gate structure and the liner spacer as a mask, an ion implantation process with very high beam energy is performed to form a low dopant density region deep inside the substrate. The dopant is a first-type dopant, which is opposite to the substrate. A lightly doped region with the first-type dopant is formed in the low dopant density region on the top portion preferably by ion implantation. An anti-punch-through region having a second-type dopant with a sufficient dopant density is formed between the low dopant density region and the lightly doped region. The second-type dopant is opposite to the first-type dopant so as to prevent a punch-through effect from occurring. A sidewall spacer is formed on the liner spacer, which is on each side of the gate structure. Using the gate structure and the spacers as a mask, an ion implantation process is performed to form a heavily doped region in the substrate on the top portion of the low dopant density region. The heavily doped region is doped with the first-type dopant and has a dopant density higher than the low dopant density region and the lightly doped region. Thus, the junction of the MOS transistor of the invention includes an interchangeable source/drain region, which includes the lightly doped region and the heavily doped region, the anti-punch-through region, and the low dopant density region below these three regions to separate these three regions from the substrate.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 2A:
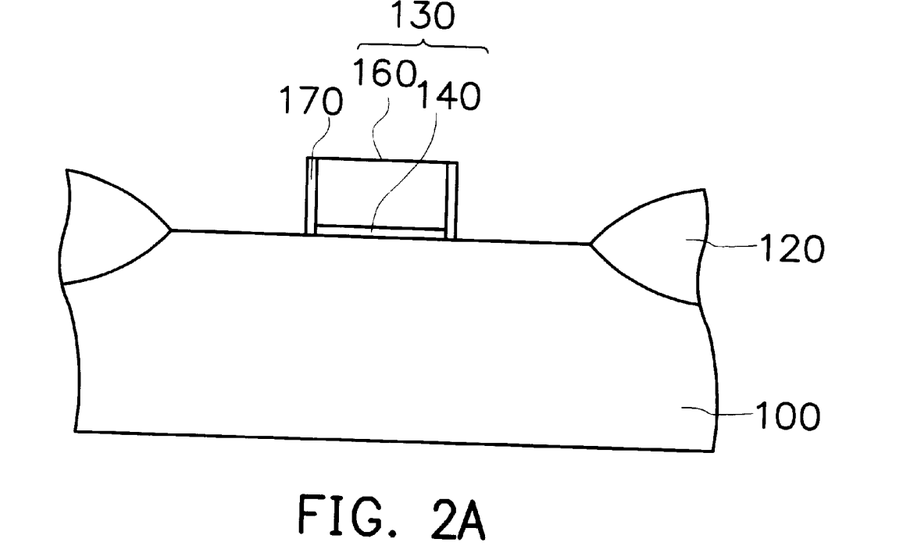
FIGS. 2A–2F are cross-section views of a MOS transistor, schematically illustrating an improved fabrication process of the MOS transistor, according to a preferred embodiment of the invention.

FIGS. 2A–2F are cross-section views of a MOS transistor, schematically illustrating an improved fabrication process of the MOS transistor, according to a preferred embodiment of the invention. In FIG. 2A, a semiconductor substrate 100 having several isolation structures, such as field oxide (FOX) layers 120, is provided. A gate structure 130 including a gate oxide layer 140 and a gate 160 on the substrate between the FOX layers 120. A silicon oxide layer (not shown) including, conformal to the substrate top surface, is formed preferably by chemical vapor deposition (CVD) to at least cover the gate structure. An etching back process is performed to remove the silicon oxide layer so that a remains of the silicon oxide layer forms a liner spacer 170 on each side of the gate structure 130. The silicon oxide layer preferably includes silicon dioxide.

Figure 2B:
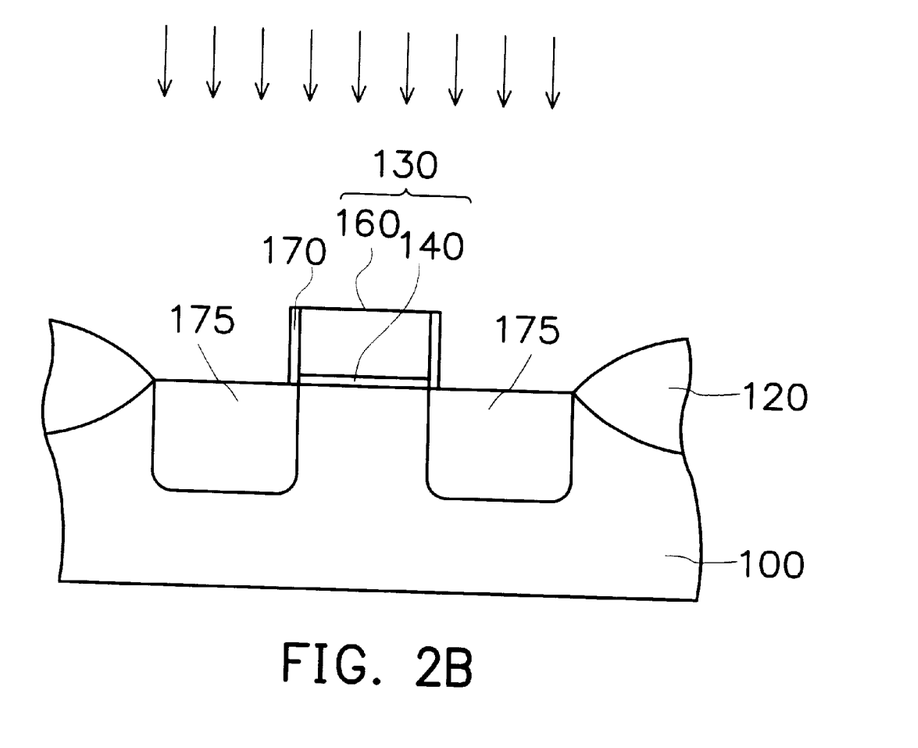

In FIG. 2B, a first ion implantation process is performed, using the gate structure 130 as a mask, to form a low dopant density region 175 deep inside the substrate 100. The dopant is a first-type, which is opposite DY complementary to the substrate 100. For example, if the substrate is a P-type substrate, the first-type dopant is an N-type dopant. If the substrate is an N-type substrate, the first-type dopant is a P-type dopant. The dopant type of the substrate 100 is also called a second-type dopant in this description. The dopant density of the low dopant density region 175 is about $10^{13}$ ions/cm$^2$. The ion beam energy is sufficiently high so as to obtain a greater depth.

Figure 2C:
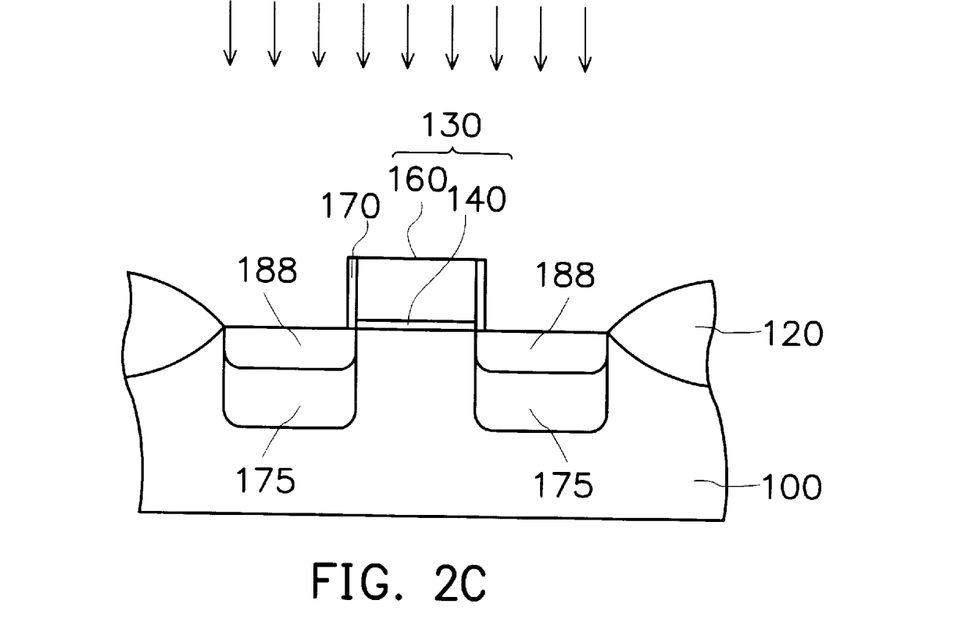

In FIG. 2C, using the gate structure 130 as a mask, a second ion implantation process is performed to form a lightly doped region 188 on the top of the low dopant density region 175 in the substrate 100. The doped dopant is the first-type dopant with a medium dopant density of about $10^{14}$ ion/cm$^2$. The lightly doped region 188 serves as a lightly doped drain (LDD) structure when an interchangeable source/drain region is formed later.

Figure 2D:
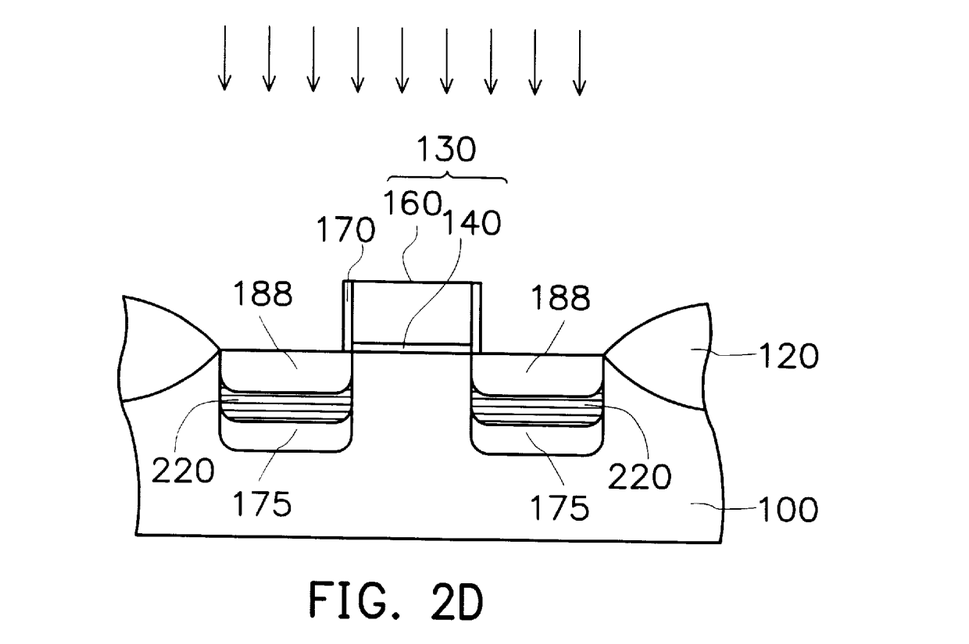

In FIG. 2D, a third ion implantation process is performed with a proper energy and the second-type dopant with a sufficient dopant density to form an anti-punch-through region 220 between the low dopant density region 175 and the lightly doped region 188. The purpose of the anti-punch-through region 220 is to prevent a punch-through effect from occurring. As stated in connection 15 with FIG. 2B, the second-type dopant is opposite to the first-type dopant.

Figure 2E:
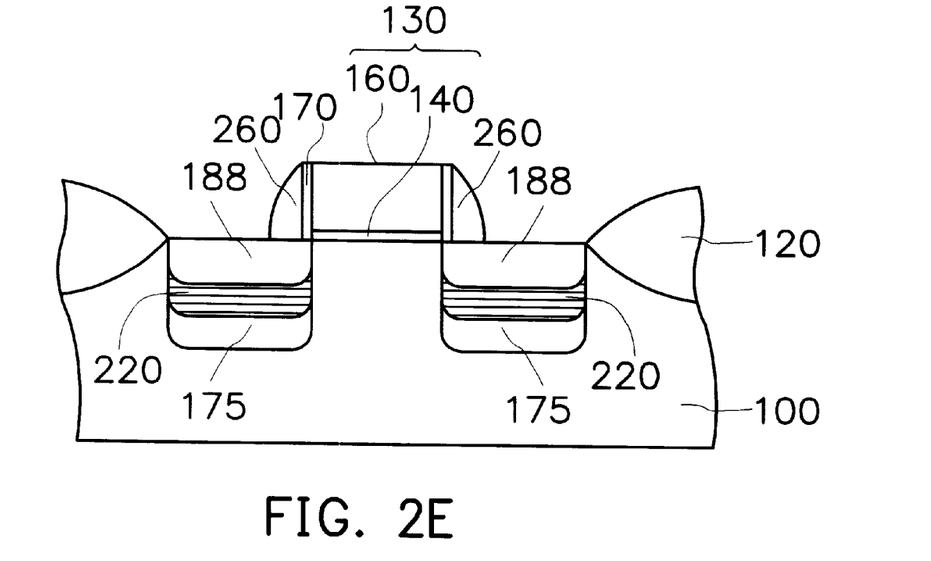

In FIG. 2E, an insulating layer (not shown) including, for example, silicon oxide or silicon nitride is formed over the substrate 100 by, example, CVD. An etching back process is performed to remove the insulating layer so that a remains of the insulating layer forms a sidewall spacer 260 on the liner spacer 170, which is on each side of the gate structure 130.

Figure 2F:
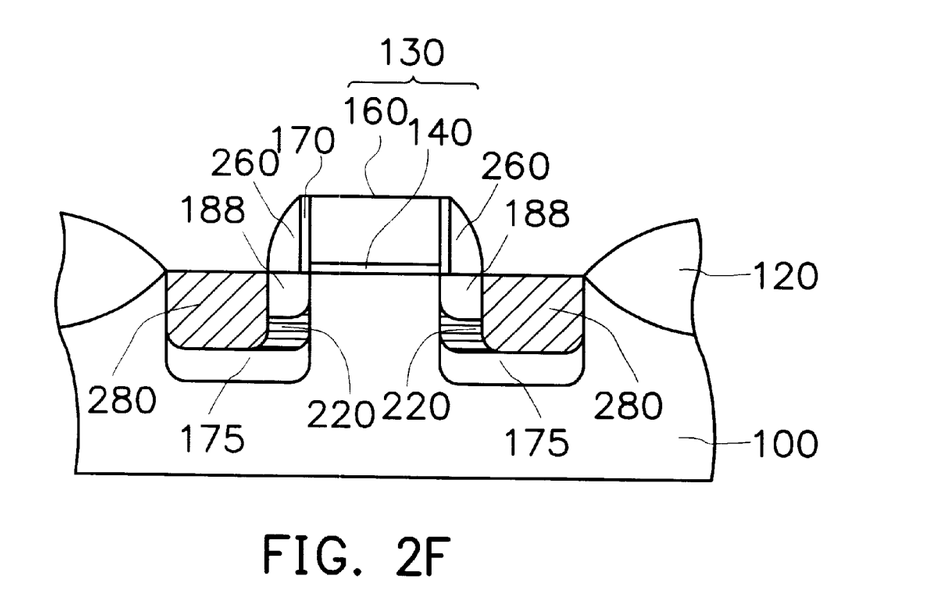

In FIG. 2F, an fourth ion implantation process is performed to form a heavily doped region 280 in the substrate 100 abutting the lightly doped region 188, the anti-punch-through region 220 and the low dopant density region 1765. After an annealing process, the heavily doped region 280 is completely formed. The heavily doped region serving a main body of the interchangeable source/drain region of the MOS transistor includes the first-type dopant with a dopant density of about $10^{15}$ ions/cm$^2$, which is higher than those of the lightly doped region 188 and the low dopant density region 175. A junction structure of the MOS transistor includes the interchangeable source/drain region, which includes the lightly doped region 188 and the heavily doped region 280, the anti-punch-through region 220, and the low dopant density region 175 below these three regions 188, 220, 280 to separate them from the substrate 100.

In the invention, the low dopant density region 175 can reduce the junction capacitance of a depletion region (not shown) between the junction structure and the substrate due to a proper distribution of the dopant density gradient. The liner spacer 170, which is different from the liner oxide layer 24 of FIG. 1B, can reduce the extension of the gate oxide layer 140 so that the overlapping region between the lightly doped region 188 and the gate structure 130 is reduced. A capacitance effect from the overlapping region is reduced. In a total improvement, the junction capacitance is reduced so that the AC operation speed is increased.

Moreover, the low dopant density region 175 is formed in a greater depth. This allows a greater depth of the interchangeable source/drain region to be formed without increasing junction capacitance. A shallow junction structure is conventionally taken so as to decrease the short channel effect. Because the depth of the interchangeable source/drain region of the invention is not necessary to be as shallow as a conventional one, a subsequent fabrication process, such as a self-aligned silicide (Salicide) process, can be easier without a worry about the Salicide being formed over-through the margin of the interchangeable source/drain margin to have an undesired contact to the substrate 100.

In conclusion, the method for fabricating a MOS transistor of the invention has several characteristic as follows:

1. The low dopant density region 175 with a lower dopant density is formed on each side of the gate structure 130 below the interchangeable source/drain region so as to form a proper dopant density gradient, which can reduce a size of the depletion region, resulting in a smaller junction capacitance.
2. The liner spacer 170 provides a smaller overlapping region between the gate structure 130 and the interchangeable source/drain region so as to reduce the gate oxide capacitance effect. The junction capacitance is further reduced.
3. Due to the property of the low dopant density region 175, the junction capacitance is effectively reduced so that a shallow junction structure is not necessary. A greater depth of the junction structure of the interchangeable source/drain region is very helpful for the subsequent fabrication process, such as a Salicide process. There is no worry about the junction structure being broken through by the Salicide structure to causes an undesired contact to the substrate 100.

The invention has been described using an exemplary preferred embodiment. However, it is to be understood that the scope of the invention is not limited to the disclosed embodiment. On the contrary, it is intended to cover various modifications and similar arrangement. The scope of the claims, therefore, should be accorded the broadest interpretation so as to encompass all such modifications and similar arrangements.

What is claimed is:

1. A method for fabricating a metal-oxide semiconductor (MOS) transistor on a semiconductor substrate having a gate structure comprising a gate oxide layer and a gate, the substrate being doped by a selected-type dopant, the method further comprising:

forming an oxide liner spacer on each side of the gate structure;

performing a first ion implantation process, using the gate structure as a mask, to form a base doped region deep inside the substrate on each side of the gate structure, wherein the base doped region comprises a first-type dopant with a first dopant density, in which the first type dopant is opposite to the selected-type dopant of the substrate;

performing a second ion implantation process to form a lightly doped region on each side of the gate structure in the based doped region, wherein the lightly doped region comprises the first-type dopant with a second dopant density and wherein the lightly doped region includes a higher dopant density than the base doped region;

performing a third ion implantation process to form an anti-punchthrough region between the base doped region and the lightly doped region in the substrate, wherein the anti-punchthrough region comprises a selected-type dopant with a third dopant density;

forming a sidewall spacer on the oxide liner spacer, which is on each side of the gate structure; and performing a forth ion implantation process, using the gate structure, the liner spacer, and the sidewall spacer as a mask, to form a heavily doped region abutting the lightly doped region, the anti-punch-through region, and the base doped region in order to serve together with the lightly doped region as an interchangeable source/drain region of the MOS transistor, wherein the heavily doped region comprises the first-type dopant with a fourth dopant density, wherein the heavily doped region includes a bottom that is separated from the substrate by the base doped region, and wherein the based doped region is disposed below the lightly doped region, the anti-punch through region, and the heavily doped region to reduce junction capacitance.

2. The method of claim 1, wherein the selected-type dopant is a P-type dopant and the first-type dopant is an N-type dopant, and wherein performing a forth ion implantation process to form a heavily doped region includes forming the heavily doped region in the base doped region.

3. The method of claim 1, wherein the selected-type dopant is an N-type dopant and the first-type dopant is a P-type dopant.

4. The method of claim 1, wherein the first dopant density is about $10^{13}$ ions/cm$^2$.

5. The method of claim 1, wherein the second dopant density is about $10^{14}$ ions/cm$^2$.

6. The method of claim 1, wherein the fourth dopant density is about $10^{15}$ ions/cm$^2$.

7. The method of claim 1, wherein the fourth dopant density is greater than the second dopant density, and the second dopant density is greater than the first dopant density.

8. The method of claim 1, wherein the third dopant density is sufficiently large to be able to prevent a punch-through effect from occurring.

9. The method of claim 1, wherein the interchangeable source/drain region is disposed at a depth that prevents an undesired contact between a silicide layer and the substrate.

10. The method of claim 1, wherein the stop of forming the oxide liner spacer further comprises:

forming an liner oxide layer over the substrate with a conformal structure; and performing an etching back process to remove the liner oxide layer so that a portion of the liner oxide layer on each side of the gate structure is remaining and forms the oxide liner spacer.

11. The method of claim 1, wherein the oxide liner spacer comprises silicon oxide.

12. The method of claim 11, wherein the oxide liner spacer comprises silicon dioxide.

13. The method of claim 1, wherein the step of forming the sidewall spacer further comprises:

forming an insulating layer over the substrate; and performing an etching back process to remove the insulating layer so that a remains of the insulating layer on the oxide liner spacer form the sidewall spacer, wherein the sidewall spacer is against the liner spacer and on the lightly doped region.

14. The method of claim 1, wherein the sidewall spacer comprises silicon nitride.

15. A method for fabricating a metal-oxide semiconductor (MOS) transistor on a semiconductor substrate having a gate structure comprising a gate oxide layer and a gate, the substrate being doped by a selected-type dopant, the method comprising:

forming an oxide liner spacer on each side of the gate structure;

forming a based doped region in the substrate on each side of the gate structure, wherein the base doped region comprises a first-type dopant with a first dopant density, in which the first-type dopant is opposite to the selected-type dopant of the substrate;

forming a lightly doped region on each side of the gate structure in the base doped region, wherein the lightly doped region comprises the first-type dopant with a second dopant density and wherein the lightly doped region includes a higher dopant density than the base doped region;

forming an anti-punch-through region between the base doped region and the lightly doped region in the substrate, wherein the anti-punch-through region comprises a selected-type dopant with a third dopant density;

forming a sidewall spacer on the oxide liner spacer, which is on each side of the gate structure; and forming a heavily doped region abutting the lightly doped region, the anti-punch-through region and the base doped region in order to serve together with the lightly doped region as an interchangeable source/drain region of the MOS transistor, in which the heavily doped region comprises the first-type dopant with a fourth dopant density, wherein the heavily doped region includes a bottom that is separated from the substrate by the base doped region, wherein if the selected-type dopant is a P-type dopant then the first type dopant is an N-type dopant, and if the selected-type dopant is an N-type dopant, then the first type dopant is a P-type dopant, and wherein the base doped region is disposed below the lightly doped region, the anti-punch through region, and the heavily doped region to reduce junction capacitance.

16. The method of claim 15, wherein the fourth dopant density is greater than the second dopant density, and the second dopant density is greater than the first dopant density.

17. The method of claim 15, wherein the third dopant density is sufficiently large to be able to prevent a punch-through effect from occurring.

18. The method of claim 15, wherein the base doped region is disposed at a depth that allows the interchangeable source/drain region to be formed inside the base doped region at a depth that prevents an undesired contact between a silicide layer and the substrate.

19. The method of claim 15, wherein the oxide liner spacer comprises silicon oxide.

20. The method of claim 15, wherein the sidewall spacer comprises silicon nitride.

* * * * *

UNITED STATES PATENT AND TRADEMARK OFFICE
CERTIFICATE OF CORRECTION

PATENT NO.   : 6,211,023 B1
DATED        : April 3, 2001
INVENTOR(S)  : Yeh et al.

It is certified that error appears in the above-identified patent and that said Letters Patent is hereby corrected as shown below:

Title page,
Item [56], References Cited, U.S. PATENT DOCUMENTS,
Number 5,950,082, please delete "8/1998" and insert -- 9/1999 --.

Claim 1,
Line 23, please delete "anti-punchthrough" and insert -- anti-punch-through --.
Line 25, please delete "anti-punchthrough" and insert -- anti-punch-through --.

Claim 10,
Line 1, please delete "stop" and insert -- step --.

Signed and Sealed this

First Day of January, 2002

*Attest:*

*Attesting Officer*

JAMES E. ROGAN
*Director of the United States Patent and Trademark Office*